United States Patent
Ahn et al.

(10) Patent No.: US 9,041,073 B2
(45) Date of Patent: May 26, 2015

(54) IMAGE SENSORS INCLUDING CHANNEL STOP REGIONS SURROUNDING PHOTODIODES AND METHODS OF FABRICATING THE SAME

(71) Applicant: Samsung Electronics Co., Ltd., Suwon-si, Gyeonggi-do (KR)

(72) Inventors: Jungchak Ahn, Yongin-si (KR); Yitae Kim, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 28 days.

(21) Appl. No.: 13/928,087

(22) Filed: Jun. 26, 2013

(65) Prior Publication Data

US 2014/0015025 A1  Jan. 16, 2014

(30) Foreign Application Priority Data

Jul. 13, 2012 (KR) .......................... 10-2012-0076624

(51) Int. Cl.
 *H01L 27/148* (2006.01)
 *H01L 27/146* (2006.01)

(52) U.S. Cl.
 CPC .... *H01L 27/14643* (2013.01); *H01L 27/14603* (2013.01); *H01L 27/1463* (2013.01); *H01L 27/14641* (2013.01)

(58) Field of Classification Search
 None
 See application file for complete search history.

(56) References Cited

U.S. PATENT DOCUMENTS

| | | | |
|---|---|---|---|
| 5,537,146 A * | 7/1996 | Tohyama | 348/311 |
| 7,439,561 B2 * | 10/2008 | Adkisson et al. | 257/233 |
| 7,564,083 B2 | 7/2009 | Sze et al. | |
| 7,800,146 B2 | 9/2010 | McKee et al. | |
| 7,879,639 B2 | 2/2011 | Ko et al. | |
| 2007/0057158 A1 * | 3/2007 | Hong | 250/214.1 |
| 2010/0133590 A1 | 6/2010 | Mheen et al. | |
| 2011/0059573 A1 * | 3/2011 | Mouli | 438/73 |
| 2011/0304000 A1 | 12/2011 | Kubo et al. | |

FOREIGN PATENT DOCUMENTS

| | | |
|---|---|---|
| JP | 5-13740 | 1/1993 |
| KR | 10-0223931 B1 | 7/1999 |
| KR | 10-0748314 B1 | 8/2007 |
| KR | 10-2010-0045212 A | 5/2010 |

* cited by examiner

*Primary Examiner* — Sonya D McCall Shepard
(74) *Attorney, Agent, or Firm* — Myers Bigel Sibley & Sajovec, PA (57) ABSTRACT

Image sensors are provided. In the image sensor, an area of a device isolation layer may be reduced and elements may be isolated from each other by a channel stop region extending between the photoelectric conversion region and the device isolation layer, such that a dark current property of the image sensor may be improved.

17 Claims, 9 Drawing Sheets

IMAGE SENSORS INCLUDING CHANNEL STOP REGIONS SURROUNDING PHOTODIODES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0076624, filed on Jul. 13, 2012, the entirety of which is incorporated by reference herein.

BACKGROUND

The inventive concept relates to image sensors and methods of forming the same.

Image sensors are semiconductor devices that convert an optical image into an electrical signal. The image sensors may be classified into charge coupled device (CCD) type image sensors and a complementary metal oxide semiconductor (CMOS) type image sensors. CIS is short for the CMOS type image sensor. The CIS includes two-dimensionally arranged pixels. Each of the pixels includes a photodiode (PD). The photodiode converts incident light into an electrical signal.

SUMMARY

Embodiments of the inventive concept may provide highly integrated image sensors capable of improving dark current properties.

Embodiments of the inventive concept may also provide methods of forming the image sensor.

According to embodiments of the inventive concept, an image sensor may include: a substrate including a plurality of pixel regions; a photoelectric converting part disposed in the substrate of each of the pixel regions; a channel stop region surrounding the photoelectric converting part; a pixel voltage applying region spaced apart from the photoelectric converting part with the channel stop region therebetween; and a first device isolation layer adjacent to only one sidewall of the pixel voltage applying region, the first device isolation layer spaced apart from the photoelectric converting part with the channel stop region therebetween.

In some embodiments, the image sensor may further include: a transfer gate disposed on the substrate at a side of the photoelectric converting part in each of the pixel regions; a floating diffusion region adjacent to a side of the transfer gate and spaced apart from the photoelectric converting part in each of the pixel regions; a reset gate adjacent to the floating diffusion region and spaced apart from the transfer gate in each of the pixel regions: and a reset drain region adjacent to the reset gate and spaced apart from the floating diffusion region in each of the pixel regions. The reset drain region may be the pixel voltage applying region; and the first device isolation layer may be disposed to be adjacent to the reset drain region.

In other embodiments, the first device isolation layer may be disposed between the floating diffusion region in one pixel region and the reset drain region in another pixel region adjacent to the one pixel region.

In still other embodiments, the first device isolation layer may be absent in at least one of a region between the reset drain region and the photoelectric converting part and a region between the reset gate and the photoelectric converting part in a plan view.

In even other embodiments, the image sensor may further include: a selection gate spaced apart from the photoelectric converting part in each of the pixel regions; a source follower gate spaced apart from the photoelectric converting part and the selection gate in each of the pixel regions; a selection source region adjacent to the selection gate and spaced apart from the source follower gate and the photoelectric converting part in each of the pixel regions; and a source follower drain region adjacent to the source follower gate and spaced apart from the selection gate and the photoelectric converting part in each of the pixel regions. The source follower drain region may be the pixel voltage applying region; and the first device isolation layer may be adjacent to the source follower drain region.

In yet other embodiments, the image sensor may further include: a second device isolation layer adjacent to the selection source region and spaced apart from the first device isolation layer.

In yet still other embodiments, the second device isolation layer may be disposed between the selection source region in one pixel region and the source follower drain region in another pixel region adjacent to the one pixel region.

In further embodiments, the image sensor may further include: a ground region disposed between the selection source region in the one pixel region and the source follower drain region in the another pixel region adjacent to the one pixel region. the second device isolation layer may be disposed between the selection source region in the one pixel region and the ground region; and the first device isolation layer may be disposed between the ground region and the source follower drain region in the another pixel region adjacent to the one pixel region.

In still further embodiments, the first device isolation layer may be absent in at least one of a region between the selection source region and the photoelectric converting part, a region between the selection gate and the photoelectric converting part, a region between the source follower gate and the photoelectric converting part, and a region between the source follower drain region and the photoelectric converting part in a plan view.

In even further embodiments, the image sensor may further include: a P-type dopant region and an N-type dopant region disposed in each of the pixel regions and adjacent to each other; and a second device isolation layer disposed between the P-type dopant region and the N-type dopant region adjacent to each other, the second device isolation layer preventing an abrupt junction between the P-type and N-type dopant regions.

In yet further embodiments, the P-type dopant region may have a dopant concentration greater than that of the substrate; and the N-type dopant region may have a dopant concentration greater than that of the photoelectric converting part.

In yet still further embodiments, the first device isolation layer may be absent between the photoelectric converting parts adjacent to each other in one direction.

According to embodiments of the inventive concept, a method of forming an image sensor may include: preparing a substrate including a plurality of pixel regions; forming a channel stop region adjacent to a boundary between the pixel regions; forming a photoelectric converting part in each of the pixel regions; and forming a first device isolation layer adjacent to the boundary between the pixel regions. The first device isolation layer may be spaced apart from the photoelectric converting part and be adjacent to a region to which a pixel voltage is applied.

According to still other embodiments of the inventive concept, an image sensor includes a substrate including a photoelectric conversion region therein having a first conductivity type. A device isolation region including an insulating material layer is provided in the substrate adjacent a boundary of the photoelectric conversion region. A channel stop region of a second conductivity type is provided in the substrate extending between the boundary of the photoelectric conversion region and the device isolation layer, where the channel stop region has a higher dopant concentration than the substrate.

In some embodiments, the channel stop region may surround or extend adjacent a periphery of the photoelectric conversion region.

In some embodiments, the channel stop region may extend into the substrate from a surface thereof to a depth beyond the photoelectric conversion region.

In some embodiments, the channel stop region may extend between the photoelectric conversion region and portion of the substrate to which a pixel voltage is applied. A boundary between the photoelectric conversion region and the portion of the substrate to which a pixel voltage is applied may be free of the device isolation region.

In some embodiments, the portion of the substrate to which the pixel voltage is applied may be a source/drain region of a transistor of the image sensor. For example, the transistor may be a reset transistor or a source follower transistor of the image sensor.

In some embodiments, the device isolation region may separate the portion of the substrate to which the pixel voltage is applied from a ground region of the substrate. The ground region of the substrate may have a conductivity type opposite to that of the portion of the substrate to which the pixel voltage is applied.

In some embodiments, the photoelectric conversion region may be a first photodiode, and a second photodiode may be provided in the substrate adjacent the first photodiode. A boundary between the first and second photodiodes may include the channel region and may be free of the device isolation region.

In some embodiments, the substrate may further include a floating diffusion region therein adjacent the photodiode. The device isolation region may separate the floating diffusion region from a transistor source/drain region of a neighboring pixel region including another photodiode.

BRIEF DESCRIPTION OF THE DRAWINGS

The inventive concept will become more apparent in view of the attached drawings and accompanying detailed description.

DETAILED DESCRIPTION OF THE EMBODIMENTS

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1:
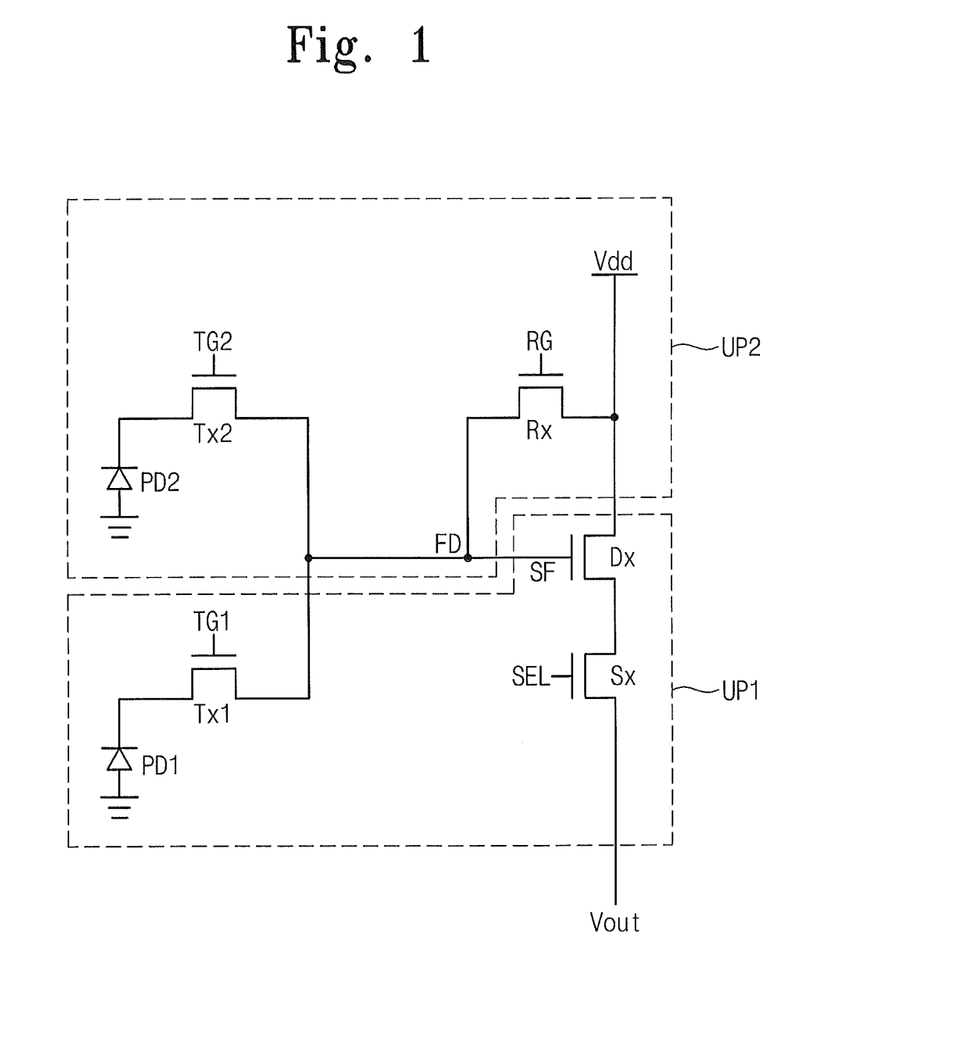
FIG. 1 is a circuit diagram of an image sensor according to some embodiments of the inventive concept.

FIG. 1 is a circuit diagram of an image sensor according to some embodiments of the inventive concept.

Referring to FIG. 1, a first pixel region UP1 is adjacent to a second pixel region UP2. The first pixel region UP1 includes a first transfer transistor Tx1, a source follower transistor Dx, and a selection transistor Sx. The second pixel region UP2 includes a second transfer transistor Tx2 and a reset transistor Rx. The first transfer transistor Tx1 includes a first transfer gate TG1 and is connected to a first photodiode PD1. The second transfer transistor Tx2 includes a second transfer gate TG2 and is connected to a second photodiode PD2. The first and second transfer transistors Tx1 and Tx2 share a floating diffusion region FD. The source follower transistors Dx, the selection transistor Sx, and the reset transistor Rx include a source follower gate SF, a selection gate SEL, and a reset gate RG, respectively. The first and second pixel regions UP1 and UP2 share the reset transistor Rx, a source follower transistor Dx, and the selection transistor Sx.

A method of operating the circuit of FIG. 1 will be described in detail.

A reset operation is performed. In more detail, a voltage applied to the reset gate RG increases to turn-on the reset transistor Rx, so that a potential of the floating diffusion region FD corresponding to a sensing node increases to a power voltage Vdd. At this time, the potential of the floating diffusion region FD may be sampled by the source follower transistor Dx and the selection transistor Sx. The sampled potential corresponds to a reference potential.

External light is incident on the photodiodes PD1 and PD2, so that electron-hole pairs (EHPs) are generated in the photodiodes PD1 and PD2 in proportion to quantity of the external light. If a voltage of the transfer gate TG1 increases, charges accumulated in the first photodiode PD1 are transferred into the floating diffusion region FD. The potential of the floating diffusion region FD drops in proportion to the quantity of the transferred charges, so that a source potential of the source follower transistor Dx is changed. If a voltage of the selection gate SEL increases to turn-on the selection transistor Sx, the changed source potential of the source follower transistor Dx is output to an output terminal Vout. The electrical signal generated from the first photodiode PD1 may be sensed by the difference between the reference potential and the output potential.

The reset operation is performed again. A voltage of the second transfer transistor Tx2 increases, so that charges accumulated in the second photodiode PD2 are transferred into the floating diffusion region PD. The potential of the floating diffusion region FD drops in proportion to the quantity of the transferred charges, so that a source potential of the source follower transistor Dx is changed. If a voltage of the selection gate SEL increases to turn-on the selection transistor Sx, the changed source potential of the source follower transistor Dx is output to an output terminal Vout. The electrical signal generated from the second photodiode PD2 may be sensed by the difference between the reference potential and the output potential.

Thereafter, the reset operation and the operating method may be repeatedly performed.

Figure 2:
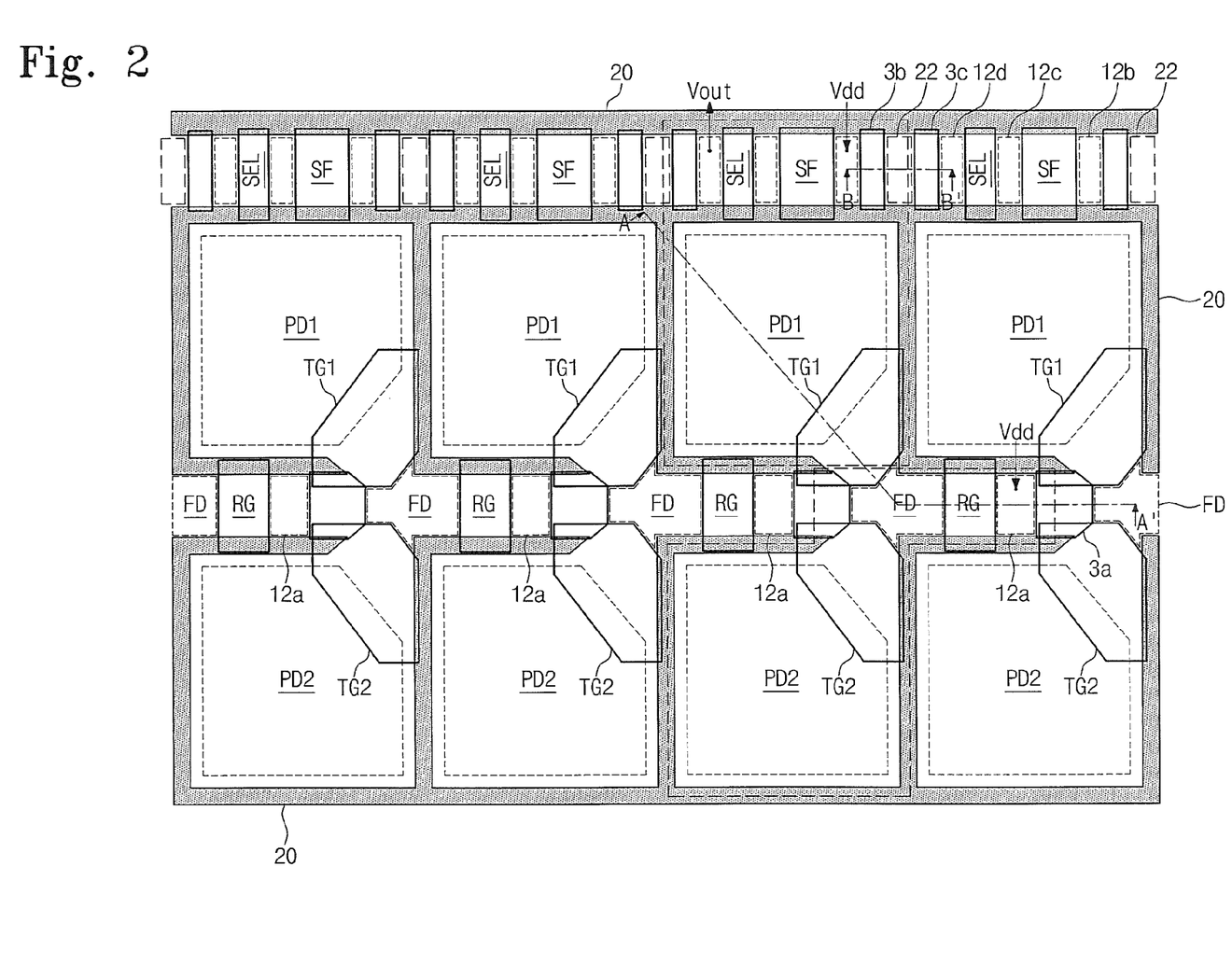
FIG. 2 is a layout of an image sensor according to some embodiments of the inventive concept.
Figure 3A:
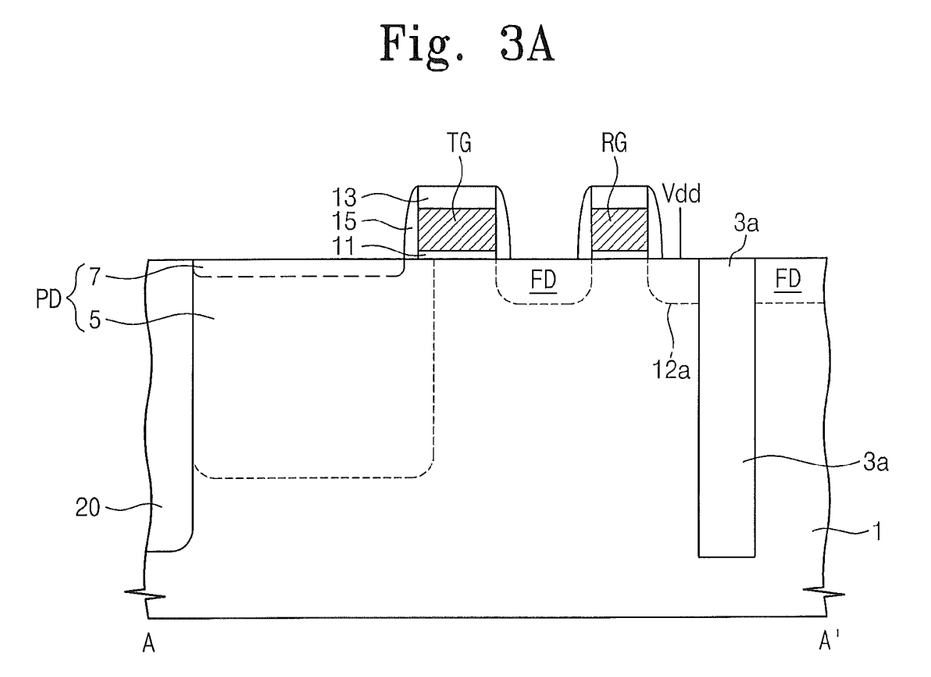
FIGS. 3A and 3B are cross-sectional views taken along lines A-A' and B-B' of FIG. 2, respectively.
Figure 3B:
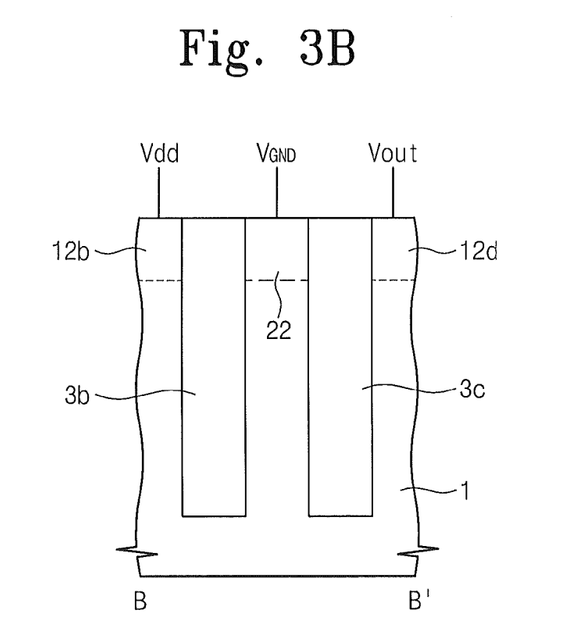

FIG. 2 is a layout of an image sensor according to some embodiments of the inventive concept. FIGS. 3A and 3B are cross-sectional views taken along lines A-A' and B-B' of FIG. 2, respectively.

Referring to FIGS. 1, 2, 3A, and 3B, a substrate 1 including a first pixel region UP1 and a second pixel region UP2 may be prepared. The substrate 1 may be a silicon wafer, a silicon-on-insulator (SOI) substrate, or a semiconductor epitaxial layer. For example, the substrate 1 may be doped with P-type dopants. A channel stop region 20 and device isolation layers or regions 3A, 3B, and 3C may be disposed at the substrate 1 to isolate pixel regions UP1 and UP2 from each other. The channel stop region 20 may be a doped region distributed from a top surface of the substrate 1 to a predetermined depth. For example, the channel stop region 20 may be doped with P-type dopants. A concentration of the P-type dopants doped in the channel stop region 20 may be greater than a concentration of P-type dopants doped in the substrate 1.

For example, the device isolation layers 3a, 3b, and 3c may be formed of at least one of a silicon oxide layer, a silicon nitride layer, and a silicon oxynitride layer. A first photoelectric conversion region or converting part PD1 and a second photoelectric conversion region or converting part PD2 are disposed in the substrate 1 in the first pixel region UP1 and the second pixel region UP2, respectively. Each of the photoelectric converting parts PD1 and PD2 may be a photodiode including a P-type dopant region 7 and an N-type dopant region 5. The photoelectric converting parts PD1 and PD2 are surrounded by the channel stop region 20. The device isolation layers 3a, 3b, and 3c are not disposed (or are absent) between the first photoelectric converting parts PD1 adjacent to each other in one direction and between the second photoelectric converting parts PD2 adjacent to each other in the one direction.

A first transfer gate TG1, a source follower gate SF, and a selection gate SEL are disposed on the substrate 1 in the first pixel region UP1. The first transfer gate TG1, the source follower gate SF, and a selection gate SEL are gate electrodes of the first transfer transistor Tx1, the source follower transistor Dx, and the selection transistor Sx, respectively. A second transfer gate TG2 and a reset gate RG are disposed on the substrate 1 in the second pixel region UP2. The second transfer gate TG2 and the reset gate RG are gate electrodes of the second transfer transistor Tx2 and the reset transistor Rx, respectively. Sidewalls of the gates TG1, TG2, RG, SF, and SEL are covered by spacers 15, respectively.

Two pixel regions UP1 and UP2 adjacent to each other share the floating diffusion region FD, the reset transistor Rx, the source follower transistor Dx, and the selection transistor Sx as illustrated with reference to FIG. 1. The floating diffusion region FD is disposed between the first transfer gate TG1 and the second transfer gate TG2. The first photoelectric converting part PD1 and the first transfer gate TG1 are symmetric to the second photoelectric converting part PD2 and the second transfer gate TG2 with respect to the floating diffusion region FD. The reset gate RG is disposed at a side of the first and second transfer gates TG1 and TG2. The reset gate RG is spaced apart from the first and second transfer gates TG1 and TG2. A reset drain region 12a spaced apart from the floating diffusion region FD is disposed at a side of the reset gate RG.

The selection gate SEL and the source follower gate SF are disposed to be adjacent to the first photoelectric converting part PD1. A source follower drain region 12b is disposed in the substrate 1 at a side of the source follower gate SF. A selection source region 12d is disposed in the substrate 1 at a side of the selection gate SEL. A source/drain region 12c is disposed in the substrate 1 between the selection gate SEL and the source follower gate SF. The source/drain region 12c may correspond to a source region of the source follower transistor Dx and a drain region of the selection transistor Sx. The floating diffusion region FD, the reset drain region 12a, the source follower drain region 12b, the source/drain region 12c, and the selection source region 12d may be doped with, for example, N-type dopants. A concentration of the N-type dopants in each of the source follower drain region 12b and the selection source region 12d may be greater than a concentration of the N-type dopants in the N-type dopant region 5 of each of the photoelectric converting parts PD1 and PD2. A pixel voltage Vdd may be applied to the reset drain region 12a and the source follower drain region 12b. The reset drain region 12a and the source follower drain region 12b may be pixel voltage applying regions. The output voltage Vout may be read from the selection source region 12d.

A ground region 22 connected to the substrate 1 may be disposed between the selection source region 12d in one first pixel region UP1 and the source follower drain region 12b in another first pixel region UP1 adjacent to the one first pixel region UP1. For example, the ground region 22 may be doped with P-type dopants. At this time, a concentration of the P-type dopants of the ground region 22 may be greater than a concentration of the P-type dopants of the substrate 1.

The device isolation layers 3a, 3b, and 3c are spaced apart from the photoelectric converting parts PD1 and PD2 and are disposed to be adjacent to edges of the pixel regions UP1 and UP2. The device isolation layers 3a, 3b, and 3c may be disposed at a region to which a high voltage such as the pixel voltage Vdd is applied, a region which is difficult to be isolated by only the channel stop region 20 due to a voltage close to the pixel voltage, and/or a region between the P-type and N-type dopant regions at which an abrupt junction may occur. In more detail, the device isolation layers 3a, 3b, and 3c may includes a first device isolation layer 3a, a second device isolation layer 3b, and a third device isolation layer 3c which are spaced apart from each other. The first device isolation layer 3a may be disposed beside only one sidewall of the reset drain region 12a to which the pixel voltage Vdd is applied. The first device isolation layer 3a is spaced apart from the photoelectric converting parts PD1 and PD2 with the channel stop region 20 therebetween. The reset drain region 12a is spaced apart from the photoelectric converting parts PD1 and PD2 with the channel stop region 20 therebetween. The first device isolation layer 3a may be disposed between the floating diffusion region FD in one second pixel region UP2 and the reset drain region 12a in another second pixel region UP2 adjacent to the one second pixel region UP2. A voltage (e.g., a voltage close to the pixel voltage Vdd) greater than a voltage generated in the photoelectric converting parts PD1 and PD2 may be applied to the floating diffusion region FD. The first device isolation layer 3a prevents the floating diffusion region FD (or the reset drain region 12a) from being changed by the neighboring reset drain region 12a (or the floating diffusion region FD).

The second device isolation layer 3b may be disposed beside only one sidewall of the source follower drain region 12b to which the pixel voltage Vdd is applied. The second device isolation layer 3b is spaced apart from the photoelectric converting parts PD 1 and PD2 with the channel stop region 20 therebetween. The source follower drain region 12b is spaced apart from the photoelectric converting parts PD1 and PD2 with the channel stop region 20 therebetween. The third device isolation layer 3c is disposed between the ground region 22 having a relatively high concentration of P-type dopants and the selection source region 12d having a relatively high concentration of N-type dopants, so that an abrupt junction between the ground region 22 and the selection source region 12d is prevented or otherwise avoided. The second device isolation layer 3b avoids or prevents an abrupt junction between the ground region 22 and the source follower drain region 12b. If the abrupt junction is formed by a high concentration of N-type dopant region and a high concentration of P-type dopant region adjacent to each other, a leakage current may occur at the abrupt junction. The second and third device isolation layers 3b and 3c may be used to prevent or otherwise avoid the abrupt junctions, so that the leakage current may be reduced or prevented.

The channel stop region 20 is disposed in other regions except the first to third device isolation layers 3a, 3b, and 3c for isolating elements from each other. In more detail, the channel stop region 20 is disposed between the reset drain region 12a and the photoelectric converting parts PD1 and PD2 and between the reset gate RG and the photoelectric converting parts PD1 and PD2 without the device isolation layers 3a, 2b, and 3c. Additionally, the channel stop region 20 may also be disposed between the selection source region 12d and the first photoelectric converting part PD1, between the selection gate SEL and the first photoelectric converting part PD1, between the source/drain region 12c and the first photoelectric converting part PD1, between the source follower gate SF and the first photoelectric converting part PD1, and between the source follower drain region 12b and the first photoelectric converting part PD1 without the device isolation layers 3a, 3b, and 3c.

As described above, the device isolation layers 3a, 3b, and 3c are disposed at only required regions, so that an area occupied by the device isolation layers may be reduced or minimized. The device isolation layers 3a, 3b, and 3c may be formed by, for example, a shallow trench isolation (STI) technique. Here, crystal defects may be generated on surfaces of the device isolation layers 3a, 3b, and 3c by etch damage. Even though an annealing process is performed, all of the crystal defects may not be cured. Thus, dangling bonds may exist on the device isolation layers 3a, 3b, and 3c. Electrons may be generated by the dangling bonds and the generated electrons may flow into the photoelectric converting parts PD1 and PD2 to deteriorate a dark current property of the photoelectric converting parts PD1 and PD2. However, according to embodiments of the inventive concept, the area of the device isolation layers 3a, 3b, and 3c may be reduced or minimized to reduce or minimize the amount of the electrons generated by the dangling bonds. Additionally, the electrons generated at the surfaces of the device isolation layers 3a, 3b, and 3c may become extinct or otherwise stopped due to the channel stop region 20 doped with the P-type dopants. Thus, the dark current property may be improved.

Even though not shown in the drawings, the gates TG1, TG2, RG, SF, and SEL may be covered by an interlayer insulating layer, and interconnections may be disposed in the interlayer insulating layer to electrically connect the gates TG1, TG2, RG, SF, and SEL. A color filter and micro lenses may be disposed on the interlayer insulating layer. Alternatively, the color filter and micro lenses may be disposed on a bottom surface of the substrate 1.

Figure 4A:
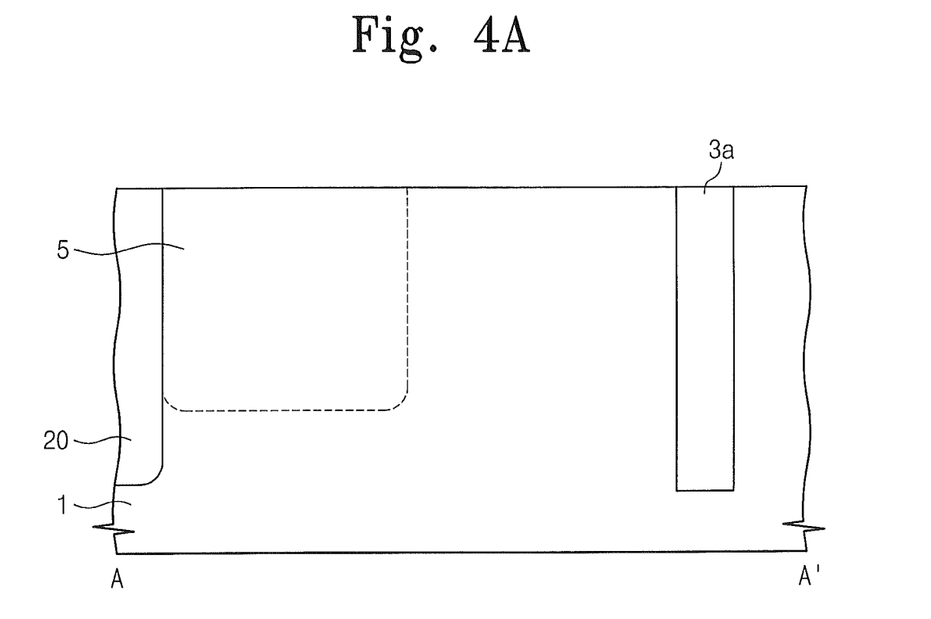
FIGS. 4A and 5A are cross-sectional views illustrating a method of forming an image sensor shown in the cross section of FIG. 3A.
Figure 4B:
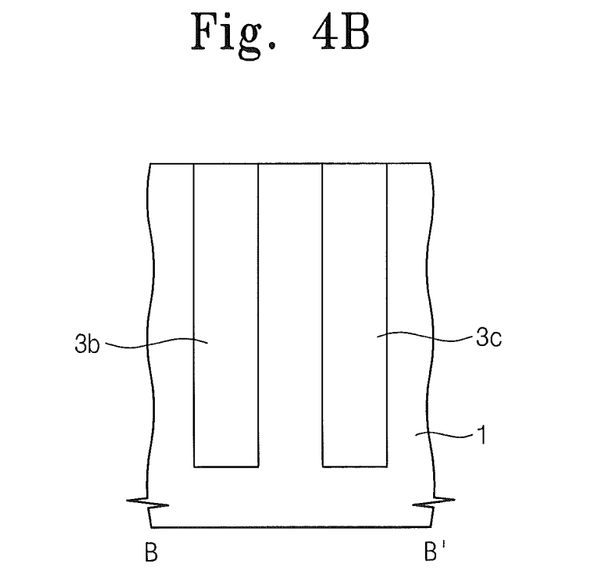
FIGS. 4B and 5B are cross-sectional views illustrating a method of forming an image sensor shown in the cross section of FIG. 3B.
Figure 5A:
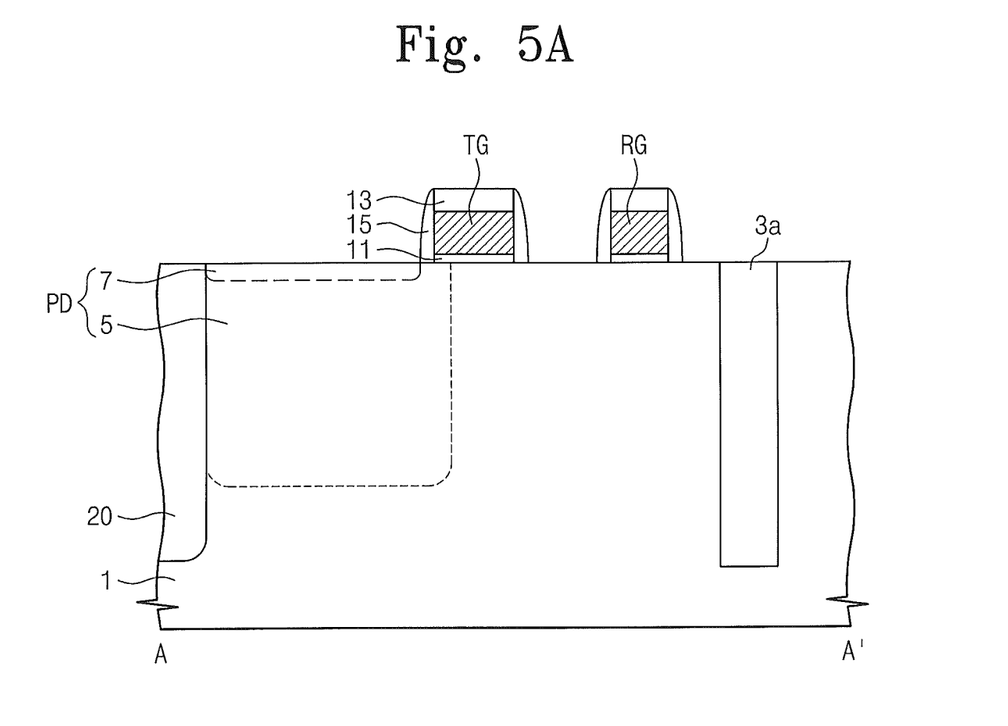
Figure 5B:
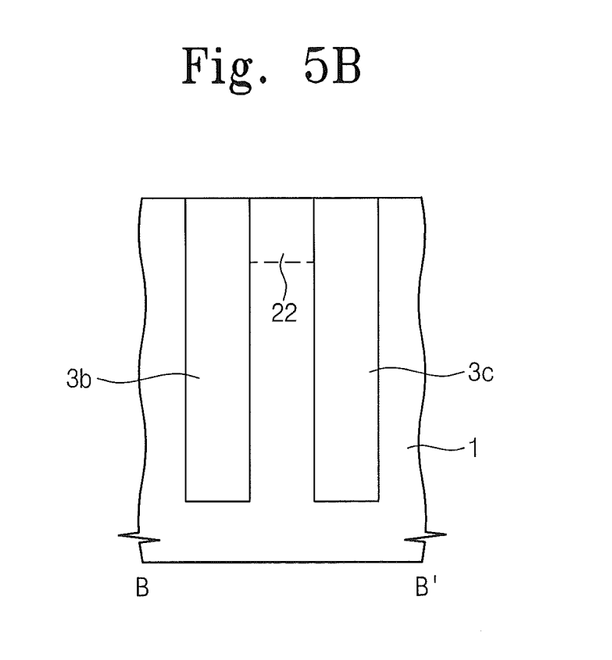

FIGS. 4A and 5A are cross-sectional views illustrating a method of forming an image sensor having a cross section of FIG. 3A. FIGS. 4B and 5B are cross-sectional views illustrating a method of forming an image sensor having a cross section of FIG. 3B.

Referring to FIGS. 2, 4A, and 4B, device isolation layers 3a, 3b, and 3c are formed in the substrate 1. The substrate 1 may be doped with P-type dopants. The device isolation layers 3a, 3b, and 3c may be formed by a STI technique. A first ion implantation process may be performed to form a channel stop region 20. The first ion implantation process for the channel stop region 20 may be performed a plurality of times by changing a projected range (Rp), so that the channel stop region 20 may be formed from a top surface of the substrate 1 to a predetermined depth. For example, the first ion implantation process may implant boron ions into the substrate 1 with a high energy at a tilt angle of about 0 degrees. Positions of the device isolation layers 3a, 3b, and 3c and the channel stop region 20 may be the same as described above with reference to FIGS. 2, 3A, and 3B. A second ion implantation process may be performed to form N-type dopant regions 5 of photoelectric converting parts PD1 and PD2.

Referring to FIGS. 2, 5A, and 5B, a gate insulating layer 11, a conductive layer, and a capping layer 13 may be sequentially stacked and then the capping layer 13, the conductive layer, and the gate insulating layer 11 may be patterned to form first and second transfer gates TG1 and TG2, a reset gate RG, a source follower gate SF, and a selection gate SEL. Spacers 15 may be formed to sidewalls of the gates TG1, TG2, RG, SF, and SEL, respectively. A third ion implantation process may be performed to form P-type dopant regions 7 of the photoelectric converting parts PD1 and PD2 and a ground region 22.

Referring to FIGS. 2, 3A, and 3B again, a fourth ion implantation process may be performed to form the floating diffusion region FD, the reset drain region 12a, the source follower drain region 12b, the source/drain region 12c, and the selection source region 12d.

The performing order of the ion implantation processes and the process forming the device isolation layers 3a, 3b, and 3c may be changed as the need arises.

Figure 6:
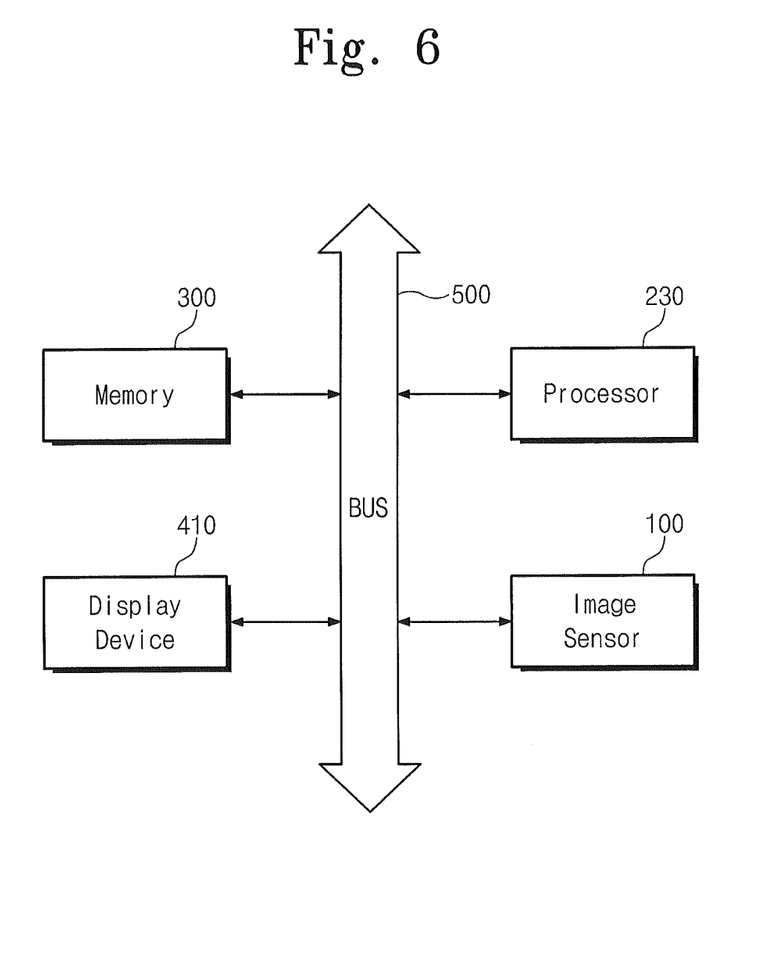
FIG. 6 is a schematic block diagram illustrating an example of electronic devices including image sensors according to embodiments of the inventive concept.

FIG. 6 is a schematic block diagram illustrating an example of electronic devices including image sensors according to embodiments of the inventive concept. The electronic device may be a digital camera or a mobile device. Referring to FIG. 6, a digital camera system may include an image sensor 100, a processor 230, a memory 300, a display 410, and a bus unit 500. The image sensor 100 may be one of the image sensors according to the aforementioned embodiments. As illustrated in FIG. 6, the image sensor 100 may capture the external image data in response to or under control of the processor 230. The processor 230 may store the captured image data in the memory 300 through the bus unit 500. The processor 230 may output the image data stored in the memory 300 to the display 410.

Figure 7:
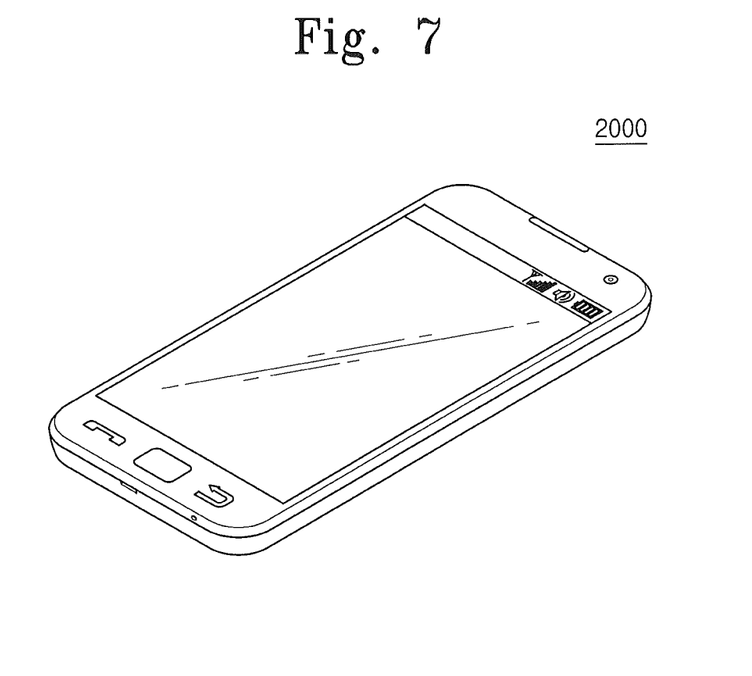
FIGS. 7 to 11 show examples of multimedia devices including image sensors according to embodiments of the inventive concept.
Figure 8:
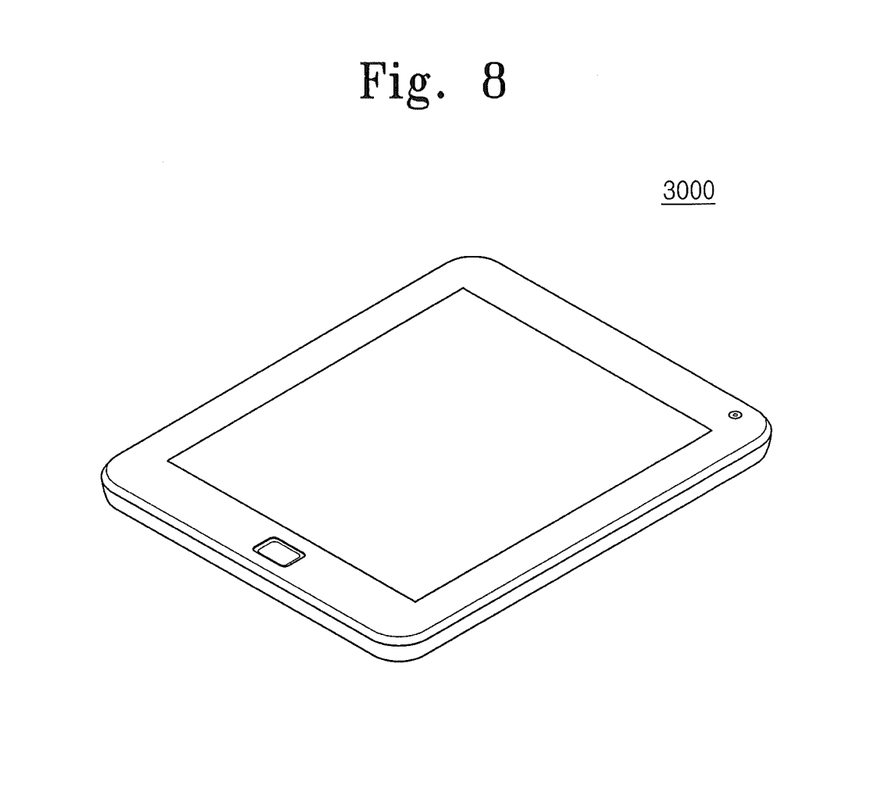
Figure 9:
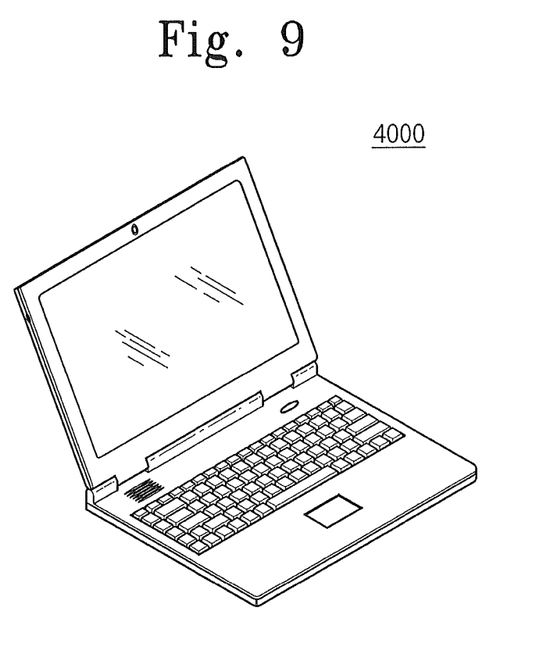
Figure 10:
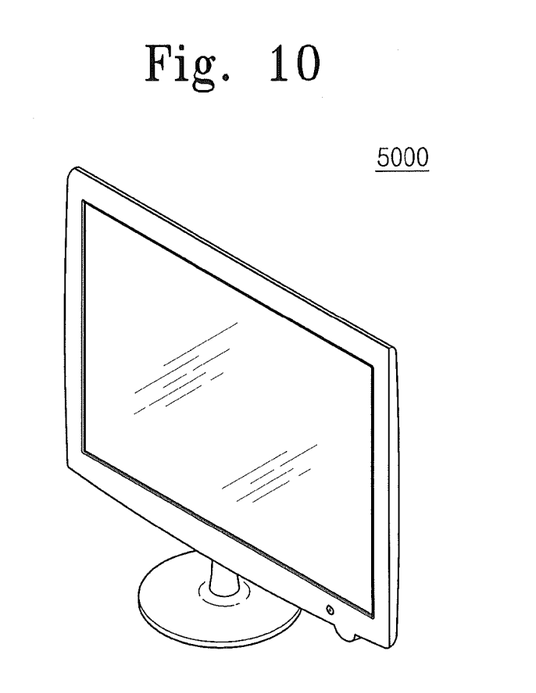
Figure 11:
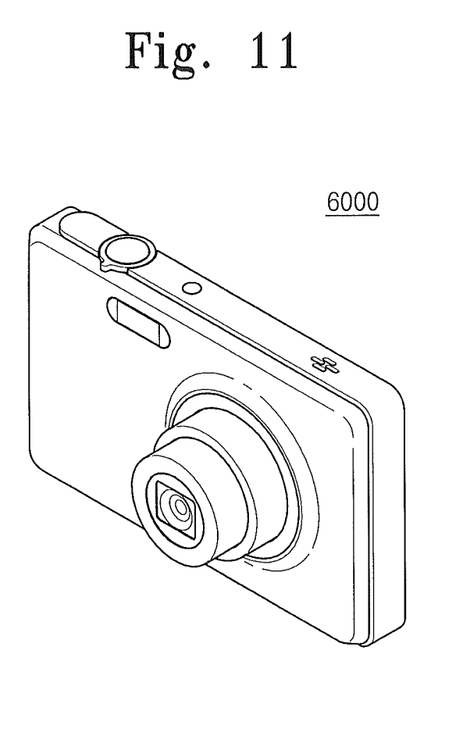

FIGS. 7 to 11 show examples of multimedia devices including image sensors according to embodiments of the inventive concept. The image sensors according to the above embodiments of the inventive concept may be applied to various multimedia devices having image photographing functions. For example, the image sensors in the aforementioned embodiments may be applied to a mobile phone or smart phone 2000 as illustrated in FIG. 7. In other embodiments, the image sensors according to the above embodiments may be applied to a tablet or smart tablet 3000 as illustrated in FIG. 8. In still other embodiments, the image sensors according to the above embodiments may be applied to a notebook computer 4000 of FIG. 9 or a television or smart television 5000 of FIG. 10. In yet other embodiments, the image sensor according to the aforementioned embodiments may be applied to a camera or digital camcorder 6000 of FIG. 11.

According to embodiments of the inventive concept, the device isolation layers are spaced apart from the photoelectric converting parts by the channel stop region. The photoelectric converting part is surrounded by the channel stop region. Additionally, the device isolation layers are disposed in only required regions such as the region to which the high voltage such as the pixel voltage is applied, and/or the region between the P-type dopant region and the N-type dopant region at which an abrupt junction may occur. As a result, the area occupied by the device isolation layers may be reduced or minimized to reduce or minimize the dark current caused by the dangling bonds of sidewalls of the device isolation layers. Thus, dark current properties of the image sensor may be improved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An image sensor comprising:
a substrate including a plurality of pixel regions;
a photoelectric converting part in the substrate in each of the pixel regions;
a channel stop region surrounding a portion of the photoelectric converting part, in plan view;
a pixel voltage applying region spaced apart from the photoelectric converting part; and
a first device isolation layer adjacent to one sidewall of the pixel voltage applying region, the first device isolation layer spaced apart from a sidewall of the photoelectric converting part,
wherein the channel stop region is disposed between the pixel voltage applying region and the photoelectric converting part and between the first device isolation layer and the photoelectric converting part.

2. The image sensor of claim 1, further comprising:
a transfer gate on the substrate at a side of the photoelectric converting part in each of the pixel regions;
a floating diffusion region adjacent to a side of the transfer gate and spaced apart from the photoelectric converting part in each of the pixel regions;
a reset gate adjacent to the floating diffusion region and spaced apart from the transfer gate in each of the pixel regions: and
a reset drain region adjacent to the reset gate and spaced apart from the floating diffusion region in each of the pixel regions,
wherein the reset drain region is the pixel voltage applying region; and
wherein the first device isolation layer is adjacent to the reset drain region.

3. The image sensor of claim 1, further comprising:
a P-type dopant region and an N-type dopant region in each of the pixel regions and adjacent to each other; and
a second device isolation layer between the P-type dopant region and the N-type dopant region adjacent to each other, the second device isolation layer separating a junction between the P-type and N-type dopant regions.

4. The image sensor of claim 1, wherein the first device isolation layer is absent between the photoelectric converting parts adjacent to each other in one direction.

5. The image sensor of claim 2, wherein the first device isolation layer is between the floating diffusion region in one pixel region and the reset drain region in another pixel region adjacent to the one pixel region.

6. The image sensor of claim 2, wherein the first device isolation layer is absent in at least one of a region between the reset drain region and the photoelectric converting part and a region between the reset gate and the photoelectric converting part in a plan view.

7. The image sensor of claim 3, wherein the P-type dopant region has a dopant concentration greater than that of the substrate, and wherein the N-type dopant region has a dopant concentration greater than that of the photoelectric converting part.

8. An image sensor comprising:
a substrate including a plurality of pixel regions;
a photoelectric converting part in the substrate in each of the pixel regions;
a channel stop region extending along a periphery of the photoelectric converting part;
a pixel voltage applying region spaced apart from the photoelectric converting part with the channel stop region interposed between the pixel voltage applying region and the photoelectric converting part;
a first device isolation layer adjacent to one sidewall of the pixel voltage applying region, the first device isolation layer spaced apart from the photoelectric converting part with the channel stop region interposed between the first device isolation layer and the photoelectric converting part;
a selection gate spaced apart from the photoelectric converting part in each of the pixel regions;
a source follower gate spaced apart from both the photoelectric converting part and the selection gate in each of the pixel regions;
a selection source region adjacent to the selection gate and spaced apart from both the source follower gate and the photoelectric converting part in each of the pixel regions; and
a source follower drain region adjacent to the source follower gate and spaced apart from both the selection gate and the photoelectric converting part in each of the pixel regions,
wherein the source follower drain region is the pixel voltage applying region; and
wherein the first device isolation layer is adjacent to the source follower drain region.

9. The image sensor of claim 8, further comprising:
a second device isolation layer adjacent to the selection source region and spaced apart from the first device isolation layer.

10. The image sensor of claim 8, wherein the second device isolation layer is between the selection source region in one pixel region and the source follower drain region in another pixel region adjacent to the one pixel region.

11. The image sensor of claim 8, wherein the first device isolation layer is absent in at least one of a region between the selection source region and the photoelectric converting part, a region between the selection gate and the photoelectric converting part, a region between the source follower gate and the photoelectric converting part, and a region between the source follower drain region and the photoelectric converting part in a plan view.

12. The image sensor of claim 10, further comprising:
a ground region between the selection source region in the one pixel region and the source follower drain region in the another pixel region adjacent to the one pixel region,
wherein the second device isolation layer is between the selection source region in the one pixel region and the ground region; and
wherein the first device isolation layer is between the ground region and the source follower drain region in the another pixel region adjacent to the one pixel region.

13. An image sensor, comprising:
a substrate including a photoelectric conversion region therein comprising a first conductivity type;
a device isolation region comprising an insulating material layer in the substrate adjacent a boundary of the photoelectric conversion region; and
a channel stop region of the first conductivity type in the substrate extending between the boundary of the photoelectric conversion region and the device isolation region and along a periphery of the photoelectric conversion region, the channel stop region having a higher dopant concentration than the substrate, wherein:
the photoelectric conversion region comprises a first photodiode, and a boundary between the first photodiode and a second photodiode in the substrate adjacent the first photodiode includes the channel stop region and is free of the device isolation region; or
the substrate further includes a floating diffusion region therein adjacent the photoelectric conversion region, and the device isolation region separates the floating diffusion region from a transistor drain region corresponding to a neighboring pixel region.

14. The image sensor of claim 13, wherein a boundary between the photoelectric conversion region and a portion of the substrate to which a pixel voltage is applied includes the channel stop region and is free of the device isolation region.

15. The image sensor of claim 13, wherein the channel stop region extends into the substrate from a surface thereof to a depth beyond the photoelectric conversion region.

16. The image sensor of claim 14, wherein the portion of the substrate to which the pixel voltage is applied comprises a drain region of a transistor of the image sensor.

17. The image sensor of claim 16, wherein the device isolation region separates the drain region from a ground region of the substrate having a conductivity type opposite thereto.

* * * * *